United States Patent
Turner et al.

(10) Patent No.: US 8,817,994 B2
(45) Date of Patent: Aug. 26, 2014

(54) AUDIO JACK RESET

(75) Inventors: John R. Turner, Portland, ME (US);
Seth M. Prentice, Auburn, ME (US)

(73) Assignee: Fairchild Semiconductor Corporation, San Jose, CA (US)

( * ) Notice: Subject to any disclaimer, the term of this patent is extended or adjusted under 35 U.S.C. 154(b) by 371 days.

(21) Appl. No.: 13/188,834

(22) Filed: Jul. 22, 2011

(65) Prior Publication Data

US 2012/0019306 A1 Jan. 26, 2012

Related U.S. Application Data

(60) Provisional application No. 61/367,266, filed on Jul. 23, 2010.

(51) Int. Cl.
*H04R 29/00* (2006.01)
*H03K 5/1254* (2006.01)

(52) U.S. Cl.
CPC .................................. *H03K 5/1254* (2013.01)
USPC ................. 381/58; 381/123; 381/74; 381/81; 381/85; 700/94

(58) Field of Classification Search
USPC ............... 381/77, 58, 123, 81, 85, 74; 700/94
See application file for complete search history.

(56) References Cited

U.S. PATENT DOCUMENTS

| | | | |
|---|---|---|---|
| 5,754,552 A | 5/1998 | Allmond et al. | |
| 6,301,344 B1 | 10/2001 | Meyer et al. | |
| 6,650,635 B1 | 11/2003 | Weinstein et al. | |
| 7,053,598 B2 | 5/2006 | Shieh et al. | |
| 7,565,458 B2 | 7/2009 | Thijssen et al. | |
| 7,869,608 B2 | 1/2011 | Sander et al. | |
| 7,916,875 B2 * | 3/2011 | Kanji | 381/58 |
| 8,064,613 B1 | 11/2011 | Helfrich | |
| 8,193,834 B2 | 6/2012 | Maher et al. | |
| 8,230,126 B2 | 7/2012 | Siulinski | |
| 8,244,927 B2 | 8/2012 | Chadbourne et al. | |
| 8,467,828 B2 | 6/2013 | Johnson et al. | |
| 8,489,782 B2 | 7/2013 | Chadbourne et al. | |
| 2005/0201568 A1 * | 9/2005 | Goyal | 381/74 |
| 2006/0147059 A1 | 7/2006 | Tang | |
| 2007/0133828 A1 | 6/2007 | Kanji | |
| 2008/0140902 A1 | 6/2008 | Townsend et al. | |
| 2008/0150512 A1 | 6/2008 | Kawano | |
| 2008/0247241 A1 | 10/2008 | Nguyen et al. | |

(Continued)

FOREIGN PATENT DOCUMENTS

| CN | 1441353 A | 9/2003 |
|---|---|---|
| CN | 1708023 A | 12/2005 |

(Continued)

OTHER PUBLICATIONS

U.S. Appl. No. 13/584,465, filed Aug. 13, 2012, Detecting Accessories on an Audio or Video Jack.

(Continued)

*Primary Examiner* — Disler Paul
(74) *Attorney, Agent, or Firm* — Schwegman, Lundberg & Woessner, P.A.

(57) ABSTRACT

This document provides apparatus and methods for providing low-power operation of an interface circuit during an interval when a port of the interface circuit is in an uncoupled state.

15 Claims, 4 Drawing Sheets

(56) References Cited

U.S. PATENT DOCUMENTS

| | | | |
|---|---|---|---|
| 2008/0298607 A1 | 12/2008 | Wu et al. | |
| 2008/0318629 A1 | 12/2008 | Inha et al. | |
| 2009/0180630 A1* | 7/2009 | Sander et al. | 381/58 |
| 2009/0198841 A1 | 8/2009 | Yoshida et al. | |
| 2010/0173673 A1 | 7/2010 | Lydon | |
| 2010/0199112 A1 | 8/2010 | Yokota et al. | |
| 2011/0085673 A1 | 4/2011 | Lee | |
| 2011/0099298 A1 | 4/2011 | Chadbourne et al. | |
| 2011/0099300 A1 | 4/2011 | Siulinski | |
| 2011/0199123 A1 | 8/2011 | Maher et al. | |
| 2012/0019309 A1 | 1/2012 | Turner et al. | |
| 2012/0057078 A1 | 3/2012 | Fincham et al. | |
| 2012/0198183 A1 | 8/2012 | Wetzel et al. | |
| 2012/0200172 A1 | 8/2012 | Johnson et al. | |
| 2012/0237051 A1 | 9/2012 | Lee | |
| 2012/0326736 A1 | 12/2012 | Chadbourne et al. | |
| 2013/0020882 A1 | 1/2013 | Prentice | |
| 2013/0021041 A1 | 1/2013 | Prentice | |
| 2013/0021046 A1 | 1/2013 | Prentice et al. | |
| 2013/0034242 A1 | 2/2013 | Prentice et al. | |
| 2014/0025845 A1 | 1/2014 | Chadbourne et al. | |

FOREIGN PATENT DOCUMENTS

| | | |
|---|---|---|
| CN | 101069410 A | 11/2007 |
| CN | 101425048 A | 5/2009 |
| CN | 101426035 A | 5/2009 |
| CN | 101729958 A | 6/2010 |
| CN | 102193047 A | 9/2011 |
| CN | 102378087 A | 3/2012 |
| CN | 102892059 A | 1/2013 |
| CN | 102892061 A | 1/2013 |
| CN | 102892067 A | 1/2013 |
| CN | 102892068 A | 1/2013 |
| KR | 20110046361 A | 5/2011 |
| KR | 1020120015265 A | 2/2012 |
| KR | 1020130011988 A | 1/2013 |
| KR | 1020130011989 A | 1/2013 |
| KR | 1020130011990 A | 1/2013 |
| KR | 1020130011991 A | 1/2013 |
| TW | 201312873 A1 | 3/2013 |
| TW | 201312874 A1 | 3/2013 |
| TW | 201314674 A1 | 4/2013 |
| TW | 201316704 A1 | 4/2013 |

OTHER PUBLICATIONS

U.S. Appl. No. 13/188,778, filed Jul. 22, 2011, Audio Jack Detection and Configuration.
U.S. Appl. No. 13/189,480, filed Jul. 22, 2011, MIC/GND Detection and Automatic Switch.
U.S. Appl. No. 13/569,869, filed Aug. 8, 2012, Audio Jack Detection Circuit.
U.S. Appl. No. 13/569,746, filed Aug. 8, 2012, Detection and GSM Noise Filtering.
U.S. Appl. No. 13/188,778, Non Final Office Action mailed Sep. 10, 2013, 18 pgs.
Chinese Application Serial No. 201010526298.1, Office Action mailed Sep. 4, 2013, 10 pgs.
Chinese Application Serial No. 201110038132.X, Office Action mailed Aug. 9, 2013, 11 pgs.
Chinese Application Serial No. 201110209512.5, Office Action mailed Sep. 4, 2013, 5 pgs.
U.S. Appl. No. 13/188,778, Final Office Action mailed Mar. 6, 2014, 15 pgs.
U.S. Appl. No. 13/188,778, Response filed Feb. 10, 2014 to Non Final Office Action mailed Sep. 10, 2013, 14 pgs.
U.S. Appl. No. 13/189,480, Non Final Office Action mailed Mar. 14, 2014, 14 pgs.
Chinese Application Serial No. 201010526298.1, Office Action mailed Apr. 3, 2014, 11 pgs.
Chinese Application Serial No. 201010526298.1, Response filed Jan. 14, 2014 to Office Action mailed Sep. 4, 2013, 16 pgs.
Chinese Application Serial No. 201110038132.X, Response filed Dec. 23, 2013 to Office Action mailed Aug. 9, 2013, 8 pgs.
Chinese Application Serial No. 201110209512.5, Response filed Jan. 20, 2014 to Office Action mailed Sep. 4, 2013, 49 pgs.
Chinese Application Serial No. 201110209513.X, Office Action mailed Feb. 8, 2014, 9 pgs.
U.S. Appl. No. 12/606,562 , Response filed Jan. 3, 2012 to Final Office Action mailed Oct. 28, 2011, 7 pgs.
U.S. Appl. No. 12/606,562 , Response filed Sep. 13, 2011 to Non Final Office Action mailed Jun. 22, 2011, 9 pgs.
U.S. Appl. No. 12/606,562, Final Office Action mailed Oct. 28, 2011, 10 pgs.
U.S. Appl. No. 12/606,562, Non Final Office Action mailed Jun. 22, 2011, 9 pgs.
U.S. Appl. No. 12/606,562, Notice of Allowance Mailed Jan. 27, 2012, 7 pgs.
U.S. Appl. No. 12/606,562, Response to Rule 312 Communication mailed May 29, 2012, 1 pgs.
U.S. Appl. No. 12/606,562, Response to Rule 312 Communication mailed Jul. 2, 2012, 2 pgs.
U.S. Appl. No. 12/606,582, Final Office Action mailed Dec. 8, 2011, 10 pgs.
U.S. Appl. No. 12/606,582, Non Final Office Action mailed Jul. 14, 2011, 8 pgs.
U.S. Appl. No. 12/606,582, Notice of Allowance mailed Apr. 12, 2012, 8 pgs.
U.S. Appl. No. 12/606,582, Response filed Mar. 6, 2012 to Final Office Action mailed Dec. 8, 2011, 10 pgs.
U.S. Appl. No. 12/606,582, Response filed Sep. 28, 2011 to Non Final Office Action mailed Jul. 14, 2011, 10 pgs.
U.S. Appl. No. 12/705,183, Notice of Allowance mailed Feb. 9, 2012, 8 pgs.
U.S. Appl. No. 13/584,465 , Response filed Jan. 9, 2013 to Non Final Office Action mailed Nov. 15, 2012, 8 pgs.
U.S. Appl. No. 13/584,465, Non Final Office Action mailed Nov. 15, 2012, 8 pgs.
U.S. Appl. No. 13/584,465, Notice of Allowance mailed Mar. 18, 2013, 7 pgs.
"Autonomous Audio Headset Switch", Texas Instruments TS3A225E, [Online]. Retrieved from the Internet: <URL: http://www.ti.com/lit/ds/scds329/scds329.pdf>, (Nov. 2011), 11 pgs.
Chinese Application Serial No. 201220044818.X, Notification to Make Rectification mailed Jul. 17, 2012, 3 pg.
Korean Application Serial No. 10-2011-0073717, Amendment Filed Aug. 19, 2011, 4 pgs.
"USB OTG Mechanical Presentation", [Online] Retrieved from the Internet on Jun. 3, 2011 http://www.usb.org/developers/onthego/london/OTG_mechanical.pdf, (Feb. 26, 2002), 27 pgs.
"USB Remote Cable", [Online]. Retrieved from the Internet: <URL: http://chdk.wikia.com/wiki/USB_Remote_Cable>, (Jun. 9, 2009), 4 pgs.
Mehta, Arpit, "Keep Power Consumption in Check with Low-Power Comparators that Autosense Plugged-In Accessories", [Online]. Retrieved from the Internet: <URL: http://www.maxim-ic.com/appnotes.cfm/an_pk/4327>, (Feb. 27, 2009), 6 pgs.

* cited by examiner

AUDIO JACK RESET

CLAIM OF PRIORITY

This patent application claims the benefit of priority, under 35 U.S.C. Section 119(e), to Turner et al., U.S. Provisional Patent Application Ser. No. 61/367,266, entitled "AUDIO JACK DETECTION AND CONFIGURATION," filed on Jul. 23, 2010, which is hereby incorporated by reference herein in its entirety.

BACKGROUND

Electronic devices, including mobile electronic devices, provide an array of features, some within very compact packaging, that make communication, messaging and exchanging of information, including audio and video information, transparent to a user. Many such devices provide ports to expand the functionality of the device or to couple the device to accessories that allow for more convenient operation of, or interaction with, the device. Some electronic devices can provide a bias signal, such as for a microphone of an accessory device. The bias signal can deplete energy from the device, such as from a battery of a mobile electronic device, even when an accessory is not coupled to a port of the device.

BRIEF DESCRIPTION OF THE DRAWINGS

In the drawings, which are not necessarily drawn to scale, like numerals may describe similar components in different views. Like numerals having different letter suffixes may represent different instances of similar components. The drawings illustrate generally, by way of example, but not by way of limitation, various embodiments discussed in the present document.

DETAILED DESCRIPTION

Figure 1:
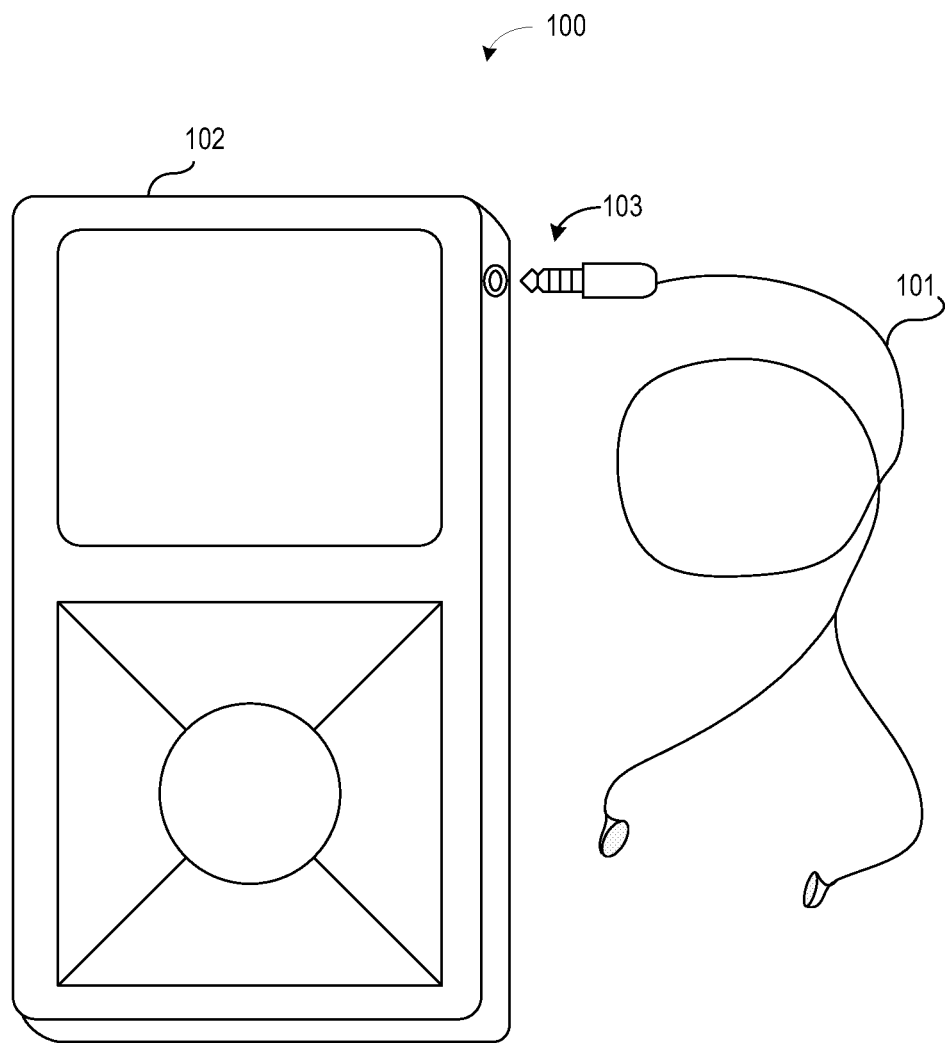
FIG. 1 illustrates generally a system employing an example interface circuit.

The present subject matter includes apparatus and methods for detecting the whether an accessory is coupled to a port of an electronic device. In an example an interface circuit can automatically configure the electronic device to disable features associated with the accessory if the accessory is not connected. More particularly, the present subject matter includes examples of an integrated, interface circuit and method of operation of the interface circuit. In an example, the interface circuit can detect the disconnection of an audio accessory, such as an earphone, or an earphone and microphone combination, from an electronic device, such as a cell phone, mobile multimedia player or personal digital assistant, and prepare the electronic device to automatically detect a connection or re-connection of an accessory in the future. In certain examples, the interface circuit consumes little if any energy when an accessory device is not coupled to the port.

Examples are provided that employ an audio jack detection (J_DET) input to automatically reset and initiate a low power state upon detecting the disconnection of an audio accessory from a port of an electronic device. In an example, upon providing an indication that the port has transitioned from a uncoupled state to a coupled state, a method can debounce the J_DET input while one or more other processes or signals of the electronic device are in a low-power mode In an example, the method can initiate processing signals related to the accessory, such as audio signals received at a microphone (J-MIC) input, when the debounce of the J_DET input is complete and the presence of an audio accessory at the port is verified. In an example, the J_DET input can be debounced while the microphone processing method is not in the reset mode, such as when verifying removal of the audio accessory from the port of the electronic device. This method of debouncing can accommodate noise on the J_DET input without disrupting other processes or signals related to the accessory such as processing audio information related to the accessory or providing a bias signal to the accessory.

In some examples, a method can provide reduced power consumption when an audio accessory is not connected to a port of the electronic device. In some examples, a method can enable a processor resource, such as an oscillator or a state machine, to assist debouncing the J-DET input when an accessory is first detected at the port of the electronic device. After determining the presence of an audio device at the port of the electronic device, a reset circuit can enable a second method, such as a second state machine, to process information related to the accessory such as audio information related to the accessory. In an example, an interface circuit can simultaneously process the audio information, and monitor and debounce the J-DET input. In an example, the method can detect noise on J_DET and prevent undesirable mode changes of the interface circuit that can otherwise occur without debouncing J_DET.

In an example, a single integrated circuit (IC) can monitor a port of an electronic device and process information related to the port. The IC can interface to a processor of the electronic device and offload processing functions, such as, detecting an accessory coupled to the port, initializing parameters and hardware to interface to the accessory, and detecting events related to the accessory such as user initiated events that can affect the operation of the electronic device. For example, the IC can reduce power consumption of the electronic device when a user removes or decouples the accessory device from the port. In another example, the IC can accommodate noisy signals introduced at the port without disrupting operation of the accessory device and can also accurately determine between a coupled state of the port and an uncoupled state of the port.

FIG. 1 illustrates generally an example system 100 employing an interface circuit circuit to interface an audio accessory 101 to an electronic device 102. The electronic device 102 can include a mobile electronic device including, but not limited to, a cell phone, a personal digital assistant, a personal media player, combinations thereof, or other electronic devices having an audio port. The accessory 102 can be a set of earphones or earplugs that can include a connector 103, such as an audio jack, that physically interfaces with an audio port of the electronic device 102, such as an audio jack receptacle. In various examples, the accessory 101 can be a set of earphones or earplugs that include a microphone. In some examples, the microphone can include a switch, such as a send/end switch for initiating and ending a cell phone call, for example. In some examples, the set of earphones or earplugs may include only one earphone or earplug.

Figure 2:
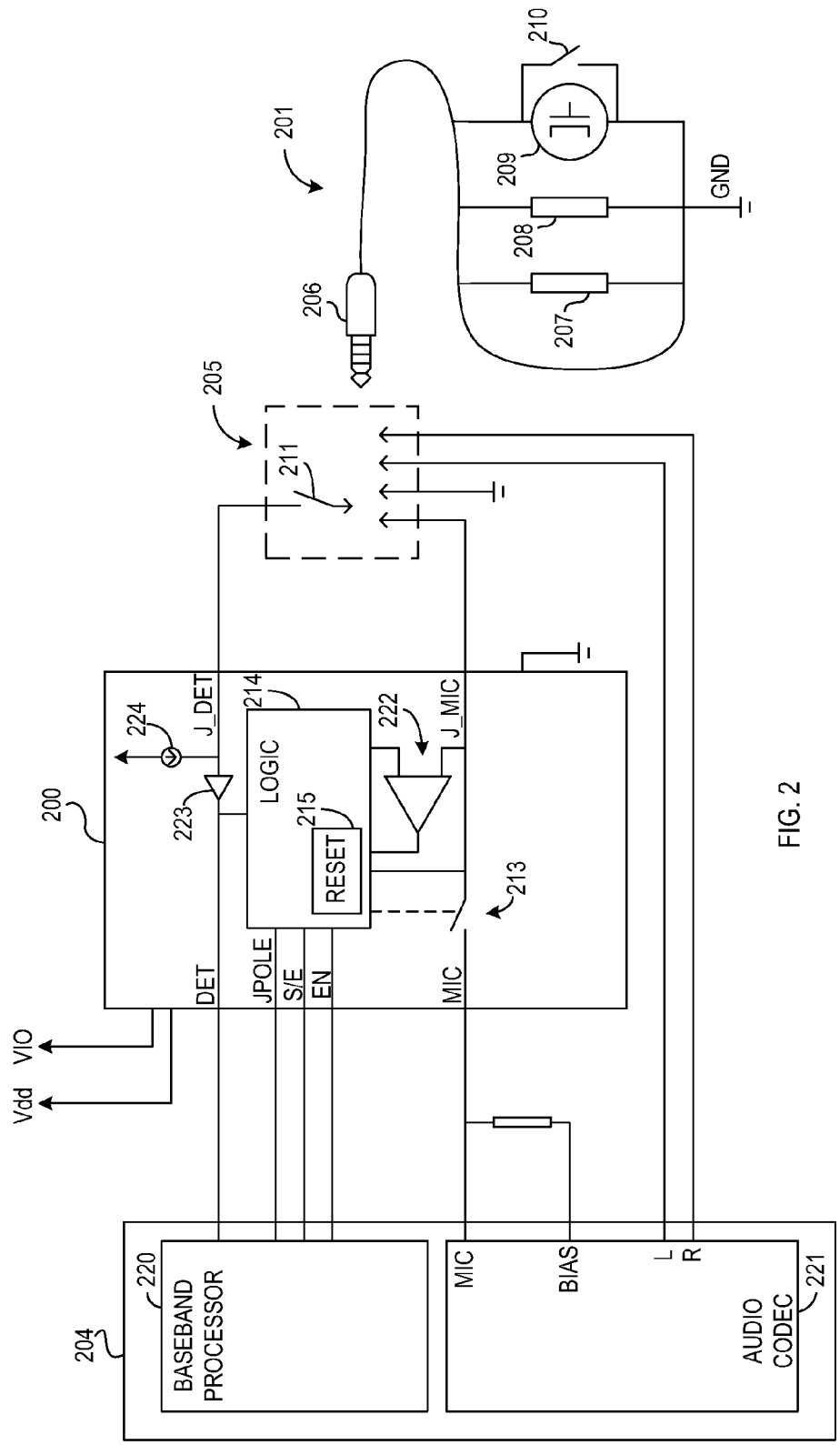
FIG. 2 illustrates generally a block diagram of an example interface circuit for interfacing an accessory to an electronic device processor.

FIG. 2 illustrates generally a block diagram of an example interface circuit 200 for interfacing an accessory 201 to an electronic device processor 204. The interface circuit 200 can includes a first power supply input VIO and a second power supply input VDD, various inputs and outputs to couple the interface circuit 200 between a port 205 of the electronic device and the processor 204 of the electronic device. In various examples, the port 205 is configured to couple to with an accessory connector 206. The connector 206 can include terminations for one or more earphones, such as a left earphone 207 and a right earphone 208. The connector 206 can include a ground termination, GND. The connector 206 can include a termination coupled to a microphone 209 of the accessory 201. The connector 206 can include a termination coupled to a switch 210 of the accessory. In an example, the microphone 209 and switch 210 of the accessory 201 share a termination of the connector 206.

In an example, the interface circuit 200 can include a comparator 222 configured to receive a microphone signal at a headset microphone terminal (J_MIC), a buffer, such as a Schmitt trigger 223, configured to receive an audio jack detection signal at an audio jack detection pin (J_DET), and a current source 224 (e.g., a 0.5 µA current source, etc.). In an example, the port 205 can include a switch device 211, in certain examples, operating as a normally open switch.

In an example, the current source 224 can be configured to provide a voltage at the Schmitt trigger 223 when the port 205 is empty that can be pulled to ground when an audio jack 206 is coupled with the port 205. In an example, the Schmitt trigger 223 can be configured to provide a detection signal to logic 214 and the processor 204. The detection signal can include a logic high signal when the port 205 is in an uncoupled state and a logic low signal when the port 205 is coupled with an audio jack connector 206 of an accessory 201.

In another example, the normally open configuration of the switch device 211 and the current source 224 (e.g., a 0.5 µA current source, etc.) of the interface circuit 200 can be replaced with a switching device having a normally closed (NC) configuration and a current sink (e.g., a 0.5 µA current sink, etc.). In other examples, one or more other example components or systems can be used. In other examples, the interface circuit 200 can use one or more other components to detect the audio jack 206 and to provide an indication of the detected audio jack to the processor 204.

In various embodiments, the interface circuit 200 can include an input J_MIC coupled to a terminal of the port 205 corresponding to the terminal of the connector 206 coupled to the microphone 210. In various examples, the port 205 can include a switch 211 for detecting the presence of the accessory connector 206 coupled to, or mated with, the port 205. In an example, the switch can be coupled to a detection input, J_DET, of the interface circuit 200. In some examples, the switch 211 is normally open and can close when an accessory connector 206 is coupled to the port 205. In certain examples, the interface circuit 200 can include a number of outputs DET, JPOLE, S/E, MIC, for interfacing with the processor 204 of the electronic device. In various examples, the interface circuit 200 includes an output DET indicative of whether an accessory 201 is coupled to the port 205. In an example, the interface circuit 200 can include an output JPOLE indicative of whether the accessory connector 206 includes a third terminal, or a third and a fourth terminal. In an example, the interface circuit 200 can include an output S/E indicative of a state of a switch 210 of the connected accessory 201. In an example, the interface circuit 200 can include an output MIC for conducting audio information between the accessory 201 and an audio processor 212 of the electronic device. In some examples, the interface circuit 200 includes an internal switch 213 to reduce leakage current associated with a terminal of the accessory 201 such as the microphone terminal MIC of the connector 206. In certain examples, the interface circuit 200 can include logic 214 to receive process and generate information between the electronic device processor 204 and the accessory 201. In certain examples, the device processor 204 can include a baseband processor 220. In certain examples, the device processor 204 can include an audio coder/decoder (CODEC). In certain examples, the device processor can include a baseband processor and an audio CODEC. In certain examples, the audio CODEC can provide a bias output, BIAS, to bias an accessory microphone 210. In an example, the interface circuit 200 can include a comparator 222 to compare the signal level of the J_MIC input to a reference voltage. When a user presses a switch 210 of the accessory device, the comparator 222 can provide an indication of the switch action to the device processor 204 using the S/E output. In certain examples, the interface circuit 200 can receive an enable input EN from the device processor 204. In an example, the EN input can enable the interface circuit 200. In an example, the EN input can be used to program or test the interface circuit 200.

In various examples, the interface circuit 200 can reduce the number of inputs and outputs required to interface an accessory 201 to the electronic device processor 204, thus freeing up valuable inputs and outputs for other resources of the electronic device. In certain examples, the interface circuit 200 can offload processing that would otherwise consume processing bandwidth of the electronic device processor 204. Thus, the interface circuit 200 can free up processing bandwidth for other processing tasks. In various examples, the interface circuit 200 can be implemented using discrete components. In some examples, the interface circuit 200 can be implemented in software. In some examples, the interface circuit 200 can be implemented using a combination of discrete components and software. In some examples, the interface circuit 200 can be implemented using a single integrated circuit chip.

Figure 3:
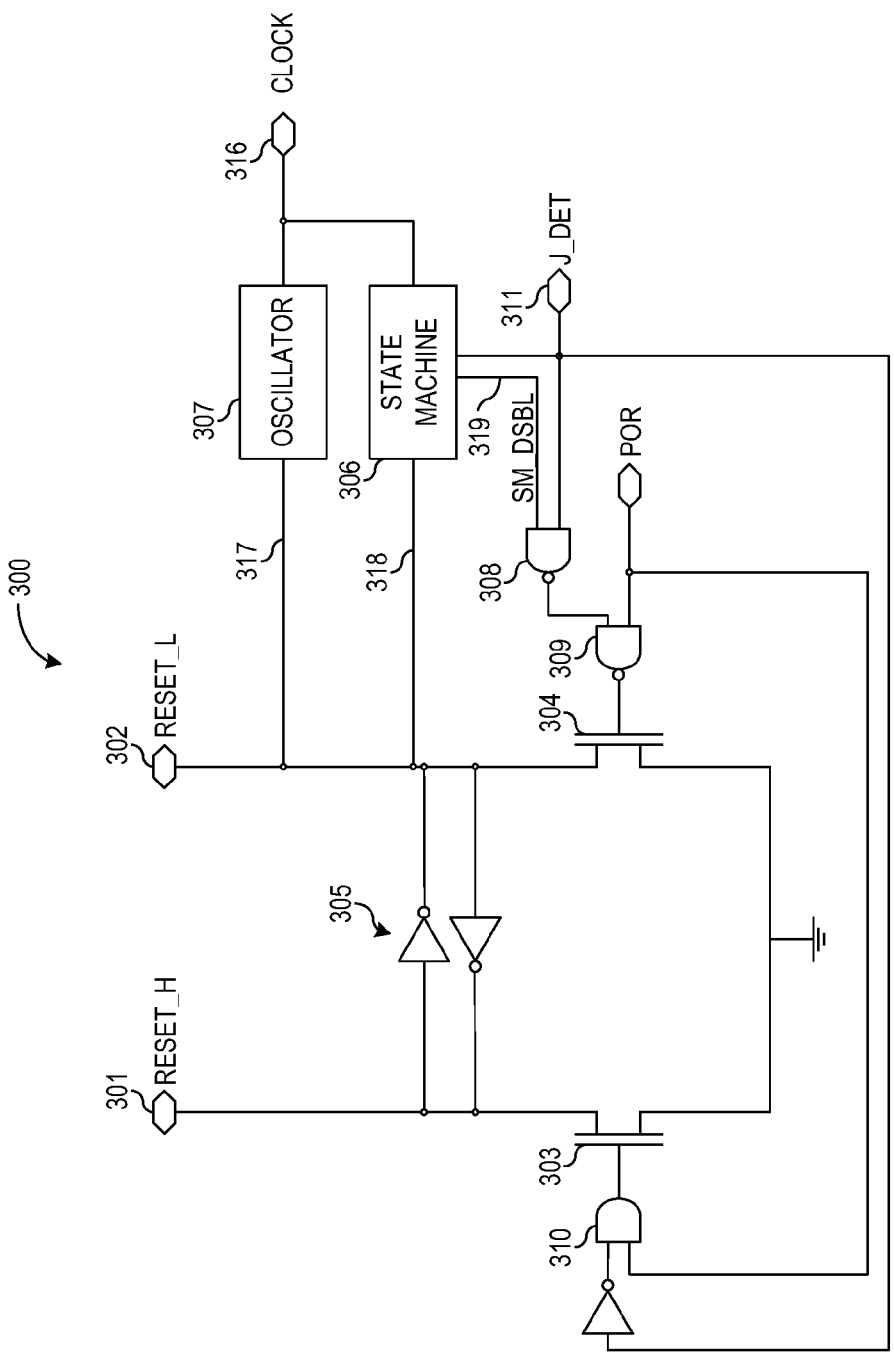
FIG. 3 illustrates generally an example reset circuit.

In various examples, the interface circuit 200 can include a reset circuit 215 for monitoring the presence of an accessory 201 coupled to the port 205 and for reducing power consumption of the interface circuit 200 when the port 205 is not coupled to an accessory 201. FIG. 3 illustrates generally an example reset circuit 315 that can include an active-high reset 301 output, an active-low reset 302 output, two control switches 303, 304, a pair of inverters 305, and logic gates 308, 309, 310. In an example, the reset circuit 300 can include an oscillator 307 to provide a clock signal, such as an oscillator 307 to debounce an input or provide a pulse train to a state machine 306. In an example, the reset circuit 300 can include one or more state machines 306 to control operation of the interface circuit 200.

The reset outputs 301, 302, in various examples, can initiate parameters or hardware to a known state. The reset circuit 300 can include two control switches 303, 304 and a pair of inverters 305 that assist in maintaining the logic level of the reset outputs 301, 302. The inverter pair 305 can maintain the state of the reset outputs 301, 302 in a complementary fashion until the control input to switches 303, 304 drive the switches such that the reset outputs 301, 302 are in complementary states. In an example, maintaining the reset outputs 301, 302 in a particular state can allow an input, such as a J_DET input 311, to be debounced without disrupting an operating state of the interface circuit 200. For example, the J_DET input 311 can be debounced if the oscillator 307 is enabled even though the signal on the J_DET input 311 flutters during the debounce routine. Consider, as is illustrated in FIG. 3, where a low J_DET input 311 indicates a coupled accessory device, that upon the J_DET input 311 going high, switch 303 tends to set the active high reset 301 to a high logic state. However, if the state machine 306 is enabled (SM_DSBL=Low), a change in the J_DET input 311 will not influence the state of switch 304. Consequently, with the state machine 306 enabled, the J_DET input 311 can be debounced without disrupting an operating state of the interface circuit. In certain examples, and upon completion of a successful debounce operation that verifies an uncoupled state of the port, state machine 306 can be disable to assume a low-power mode of the device. In certain examples, if a the debounce operation fails to verify the uncoupled state of the port, assuming that the port was coupled to an accessory, the J_DET input 311 can return to a low logic level and switch 303 can pull the active high reset output 301 low using logic gate 310, thus indicating the continued presence of a coupled accessory device. The above discussion assumes the Power-on-Reset (POR) signal is high. In various examples, the POR signal can indicate a state of the overall circuit including, for example, the state of the power supplies of the circuit. In an example, POR is at a low logic state when the power supplies are not supplying voltage within a predetermined range, such as when the supplies are off or ramping up to voltage. When the power supplies are supplying voltage within the predetermined range, POR can go to a high logic level. It is understood that POR can be responsive to other operating conditions in addition to power supply conditions without departing from the scope of the present subject matter.

The reset circuit 300 can be coupled to an oscillator 307 and a state machine 306. The state machine 306 can use a clock output 316 of the oscillator 307 to sequence the state machine 306. The oscillator 307 can include an enable input 317 coupled to the active low reset output 302 such that when the active low reset output 302 goes to a low logic level, the oscillator 307 can be disabled. In an example, disabling the oscillator 307 can disable the sequencing of the state machine 306. In some examples, the state machine 306 can also include an enable input 318 coupled to the active low reset 302. Such an enable input 318 can be used to stop the state machine 306 and optionally redirect operation of the state machine 306 to reset. The state machine 306 can include an input coupled to the J_DET input 311 to allow the state machine 306 to debounce the signal on the J_DET input 311. The state machine 306 can include an output (SM_DSBL) 319 indicative of a state of the state machine 306. In an example, the state machine output 319 is low when the state machine 306 is active and high when the state machine 306 is inactive or disabled. The state machine output 319 can couple to a logic gate 308 of the reset circuit 300 and can control when the reset circuit 300 sets the reset outputs 301 302 to their respective reset states. When in a reset state, an interface circuit that includes the reset circuit 300 can use less power than a non-reset state because state machines of the interface modules are not active and signals, such as bias signals are isolated from ports. In various examples, a low-power mode of an interface circuit is desired when an accessory is not connected to a port of the electronic device. However, it is undesirable to have the interface circuit enter a reset or low power state if noise on the J_DET input 311 indicates a transition between an accessory being coupled to the port and not coupled to the port or vice versa. Thus, the state machine output 319 can allow an interface circuit to remain enabled without interruption even though the J_DET input 311 indicates a decoupling of an accessory from a port of the electronic device. Upon completing a debounce routine and confirming that an accessory is not coupled to the port, the state machine 306 can be disabled and the interface circuit can proceed to a low power state including disabling the oscillator 307 and other hardware and processes related to the port. In the illustrated example, a logic gate 308 NANDs the output 319 of the state machine 306 with the signal at the J_DET input 311. In an example, the output 319 of the state machine 306 can be high logic when the state machine 306 is disabled, and the J_DET input 311 can be high logic when the port is in a uncoupled state (e.g., an accessory is not coupled to the port). The NAND gate 308 output can be low logic when the J_DET input 311 and the output 319 of the state machine 306 are high logic. Low logic levels at an input of gate 309 turn on control switch 304. The active low reset 302 assumes a low logic level and disables the oscillator when a low logic level is present on the control input of gate 304.

When the reset circuit 300 is in a reset or low-power mode, e.g., switch 303 off and switch 304 on, a transition of the J_DET input 311 from high (e.g., uncoupled state, accessory unplugged) to low (coupled state, accessory connected) can cause the interface circuit to exit reset, or the low power mode. On the left side of the circuit, when the J_DET input 311 goes to a low logic level, and the POR signal is high, switch 303 responding to the logic high signal turning switch 303 on can pull the active high reset signal 301 low. On the right side of the reset circuit 300, the active low reset 302 can assume a high logic level when several conditions are met. In an example, one condition in which the active low reset output 302 can assume a high logic level is when the J_DET input 311 is at a low logic level indicating an accessory is coupled to the port. A low logic level at the J_DET input 311 can produce a high output of logic gate 308. In an example, logic gate 309 can NAND the high logic level output of logic gate 308 with the high logic level of POR to turn off switch 304, thus releasing the active low reset output 302, for example, to be pulled high by other components.

Figure 4:
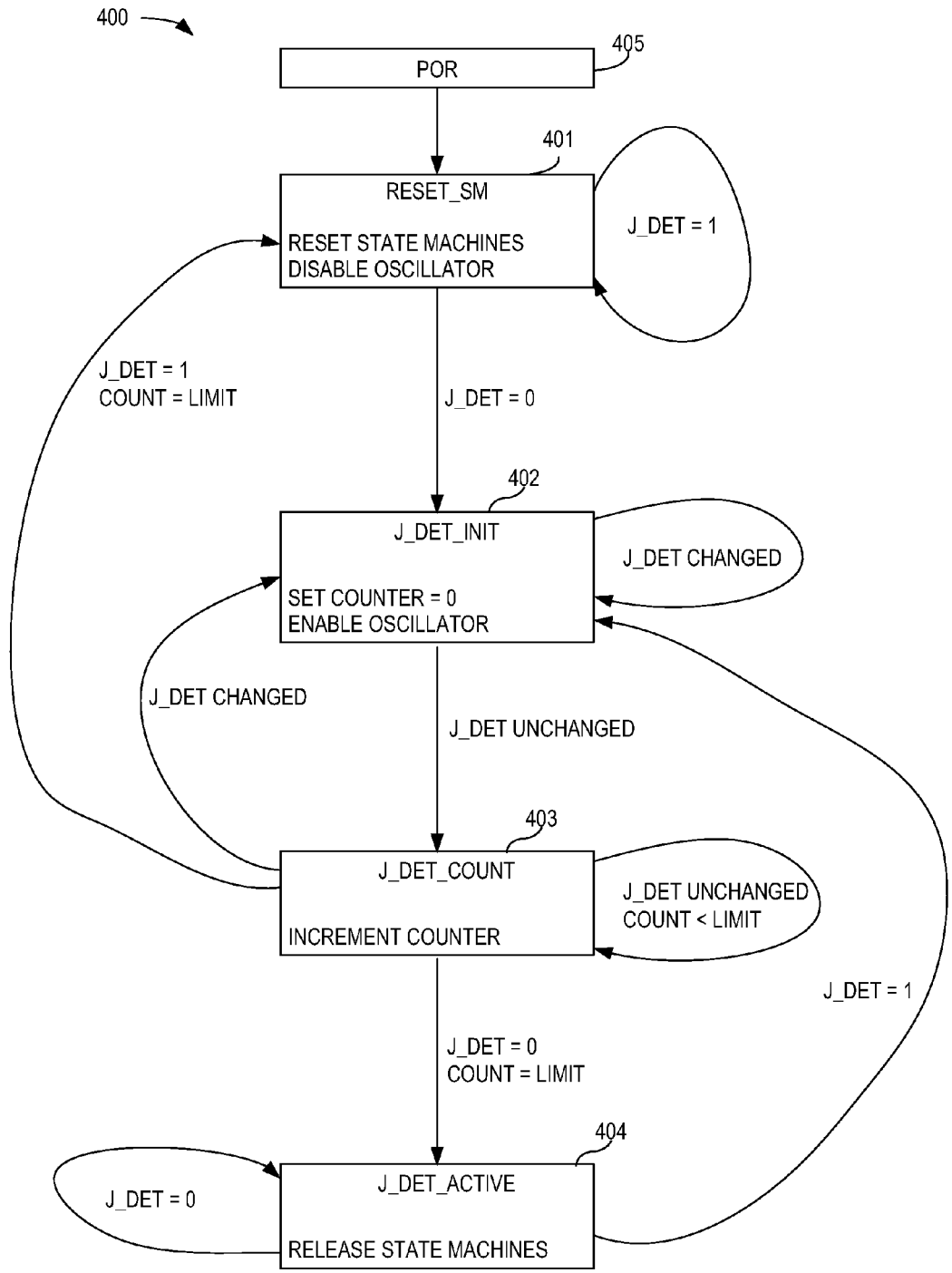
FIG. 4 illustrates generally an example reset state machine.

The reset circuit 300 of FIG. 3 can operate in conjunction with the state machine 306 of an interface circuit such as the example interface circuit 200 of FIG. 2. In an example, multiple state machines can run simultaneously with the state machine 306. In certain examples, state machines can detect specific aspects of an accessory such as whether the accessory includes a microphone. Some state machines can detect the operation of a switch included with the accessory such as a send/end switch. FIG. 4 illustrates generally a state machine diagram of an example reset state machine 400. In certain examples, the reset state machine 400 can detect the coupling and decoupling of an accessory with a port of an electronic device. In an example, the reset state machine 400 can direct control of an interface circuit to a low power state when an accessory is not coupled to the port. In an example, the reset state machine 400 can return control of the interface circuit from the low power state when an accessory is coupled to the port. In an example, the reset state machine 400 can reduce directing control of the interface circuit to the low power state when an accessory is coupled to the port and noise is present on an accessory detection input, such as the J_DET input 311 discussed above with reference to FIG. 3.

In certain examples, the reset state machine 400 can enter a reset state machine (RESET_SM) state 401 from a power-on-reset (POR) state 405 when the device is first turned on. The RESET_SM state 401 can issue a command to reset other state machines of the interface circuit. In certain examples, a command to reset other state machines of the interface circuit can disable, or suspend, the operation of the other state machines reducing power consumption of the interface circuit. In some examples, the reset state machine 400 remains in the RESET_SM state when the J_DET input is high and the oscillator is disabled. In certain examples, the reset state machine 400 can transition, or jump, from the RESET_SM state 401 to a detection initialization (J_DET_INIT) state 402 when the J_DET input goes to a low logic level. As discussed above, the J_DET input can be an input to an interface circuit indicative of the coupled or uncoupled state of a port coupled to the interface circuit. In an example, the J_DET input can be indicative of a state of an accessory detection switch coupled to, or part of the port. In an example, the J_DET input can indicate an accessory is coupled to the port using a low logic level and can indicate the absence of an accessory coupled to the port using a high logic level. The transition between the RESET_SM state 401 and the J_DET_INIT state 402 can happen even when noise is detected on the J_DET input. The J_DET_INIT state 402 can initialize a counter. In certain examples, a general reset of the electronic device executing the reset state machine 400 can cause execution of the reset state machine to jump to the RESET_SM state 401.

In an example, upon initializing the counter at the J_DET_INIT state 402, the reset state machine 400 can transition to a count state (J_DET_COUNT) state 403. In an example, the J_DET_COUNT state 403 can increment the counter at a frequency determined by the oscillator as long as the J_DET input remains in the state it was in when the reset state machine 400 entered into the J_DET_INIT state 402. If the J_DET input changes while in either the J_DET_INIT state 402 or the J_DET_COUNT state 403, the counter is reset in the J_DET_INIT state 401 and operation continues until the counter reaches a predetermined value, such as a threshold value. When the counter reaches the predetermined value, the reset state machine 400 can transition out of the J_DET_COUNT state 403 to one of two other states. In the illustrated state machine example of FIG. 4, the counter is initialized and allowed to increment to a predetermined maximum value. It is understood that other methods of initializing and incrementing the counter are possible without departing from the scope of the present subject matter including initializing the counter to a predetermined value and decrementing to a predetermined minimum value, such as zero.

In an example, if the J_DET input remained at low logic during the J_DET_COUNT state 403, it is assumed that the J_DET input indicates that an accessory is coupled to the port of the electronic device and the reset state machine 400 can transition to a J_DET_ACTIVE state 404. In an example, the J_DET_ACTIVE state 404 can withdraw the RESET_SM command and the reset state machine 400 can remain in the J_DET_ACTIVE state 404 as long as the J_DET input remains at a low logic level. In certain examples, withdrawing the RESET_SM command can release operation of other state machines of the interface module. In various examples, other state machine can detect a particular configuration of the accessory, such as whether the accessory includes a microphone or a switch. Other state machines can detect operation of a user control on the accessory. In some examples, other state machines can detect a particular accessory configuration and the operation of a user control on the accessory. In an example, other state machines can couple a bias signal to the port of the interface module, such as a microphone bias signal.

In an example, if the J_DET input remained at a high logic level during the J_DET_COUNT state 403 of the reset state machine 400, the reset state machine 400 can transition back to RESET_SM state 401 indicating the circuit has verified that the port is in an uncoupled state. The RESET_SM state 401 can issue the RESET_SM command to allow the interface circuit to enter a low power state. In an example, issuing the RESET_SM command can isolate a bias signal from the port.

In certain examples, if the reset state machine 400 is in the JDET_ACTIVE state 404 and the J_DET input assumes an active high logic level, the reset state machine 400 can transition to the J_DET_INIT state to debounce the transition of the J_DET input. Note that the reset state machine 400 can debounce each transition of J_DET input to eliminate changing the state of the interface circuit should noise be responsible for creating the transition in J_DET input.

In certain examples, the J_DET input can be debounced to ensure a true removal of an audio jack from the port and a RESET_SM command can be asserted to enter a low power state. In an example a low signal on the J_DET input can bring the interface circuit out of a low-power mode and enable the oscillator. In certain examples, digital logic can capture a decoupled state of the port using the J_DET input, initiate the debounce counter, and maintain the operation of the interface circuit until the debounce counter has finished.

Additional Notes

In Example 1, a method includes detecting a first transition of an port from a coupled state to an uncoupled state using a first signal, debouncing the uncoupled state of the port using an oscillator, maintaining operation of a second state machine while the uncoupled state of the port is debounced, and disabling the second state machine after successfully debouncing the uncoupled state of the port, wherein the disabling the second state machine includes isolating a bias signal from the port to provide a low-power operating mode.

In Example 1A, the method of Example 1 optionally includes setting a reset output after after successfully debouncing the uncoupled state of the port and disabling the second state machine using the reset output.

In Example 2, the method of Examples 1 optionally include disabling the oscillator and the first state machine after successfully debouncing the uncoupled state of the port.

In Example 2A, the method of any one or more of Examples 1-2 optionally includes disabling the oscillator and the first state machine using the reset output.

In Example 3, the debouncing the uncoupled state of the port of any one or more of Examples 1-2, including Example 2A, optionally includes resetting a counter, detecting if the uncoupled state of the port has changed, if the uncoupled state of the port has not changed, the method includes incrementing the counter, checking if a value of the counter has reached a threshold value, if the value of the counter has reached the threshold value, the method includes indicating a successful debounce of the uncoupled state of the port, and if the value of the counter has not reached the threshold value, the method includes jumping to the detecting if the uncoupled state of the port has changed.

In Example 4, if the uncoupled state of the port has changed to the coupled state of any one or more of Examples 1-3, the method optionally includes debouncing the coupled state of the port using the oscillator.

In Example 5, the method of any one or more of Examples 1-4 optionally includes detecting a second transition of the port from the uncoupled state to the coupled state using the first signal, enabling a disabled oscillator using the first signal, enabling a first state machine using the first signal, debouncing the coupled state of the port using the oscillator and the first state machine, and enabling a second state machine after successfully debouncing the coupled state of the port.

In Example 5A, the method of any one or more of Examples 1-4 optionally includes resetting the reset output using the first signal, enabling a disabled oscillator using the reset output, and enabling a first state machine using the reset output.

In Example 6, the method of any one or more of Examples 1-5, including Example 5A, optionally includes disabling the oscillator and the first state machine after unsuccessfully debouncing the coupled state of the port.

In Example 7, the debouncing the coupled state of the port of any one or more of Examples 1-6 optionally includes resetting a counter, detecting if the coupled state of the port has changed. If the coupled state of the audio connector has not changed, the method includes incrementing the counter and checking if a value of the counter has reached a threshold value. If the value of the counter has reached a threshold value, the method includes indicating a successful debounce of the coupled state of the port, and if the value of the counter has not reached the threshold value, the method includes jumping to the detecting if the coupled state of the first port has changed.

In Example 8, if the coupled state of the port has changed to an uncoupled state in any one or more of Examples 1-7, the method optionally includes resetting the counter.

In Example 9, the enabling the second state machine of any one or more of Examples 1-8 optionally includes coupling the bias signal to the port.

In Example 10, the isolating a bias signal from the port of any one or more of Examples 1-9 optionally includes isolating a microphone bias signal from an audio port.

In Example 11, an apparatus for providing a low power operating mode includes an audio port configured to provide a bias signal to an accessory device during a coupled state, a first state machine configured to debounce transitions of the audio port between the coupled state and an uncoupled state, and a switch configured to isolate the bias signal from the audio port during the uncoupled state to provide the low-power operating mode.

In Example 12, the apparatus of any one or more of Examples 1-11 optionally includes a a reset circuit configured to receive a signal indicative of a first transition of the audio port from the coupled state to the uncoupled state, and to maintain operation of a second state machine while the first transition is debounced.

In Example 13, the reset circuit of any one or more of Examples 1-12 is optionally configured to to receive a signal indicative of a second transition of the audio port from the uncoupled state to the coupled state, and to enable an oscillator and the first state machine to debounce the second transition.

In Example 14, a portable electronic device includes a port configured to couple to an accessory device, the port including a first switch configured to provide an indication of a coupled state of the port and an uncoupled state of the port, a first state machine configured to debounce transitions between the coupled state and the uncoupled state, a second state machine configured to process information received from the accessory device during the coupled state, a second switch configured to couple a bias signal to the port during the coupled state and to isolate the bias signal from the port during the uncoupled state, and a reset circuit configured to initiate the first state machine upon a transition of the port from the uncoupled state to the coupled state, and to maintain operation of the second state machine during a transition of the port from the coupled state to the uncoupled state.

In Example 15, the port of any one or more of Examples 1-14 optionally includes an audio port.

In Example 16, the port of any one or more of Examples 1-15 includes an audio jack receptacle.

In Example 17, the reset circuit of any one or more of Examples 1-16 optionally includes first and second outputs and first and second inverters coupled between the first and second outputs, wherein the first and second inverters are configured to maintain the first and second outputs in a complementary state during the transitions of the audio port between the coupled state and the uncoupled state.

Example 18 can include, or can optionally be combined with any portion or combination of any portions of any one or more of Examples 1-17 to include, subject matter that can include means for performing any one or more of the functions of Examples 1-17, or a machine-readable medium including instructions that, when performed by a machine, cause the machine to perform any one or more of the functions of Examples 1-17.

The above detailed description includes references to the accompanying drawings, which form a part of the detailed description. The drawings show, by way of illustration, specific embodiments in which the invention can be practiced. These embodiments are also referred to herein as "examples." Such examples can include elements in addition to those shown or described. However, the present inventors also contemplate examples in which only those elements shown or described are provided. Moreover, the present inventors also contemplate examples using any combination or permutation of those elements shown or described (or one or more aspects thereof), either with respect to a particular example (or one or more aspects thereof), or with respect to other examples (or one or more aspects thereof) shown or described herein.

All publications, patents, and patent documents referred to in this document are incorporated by reference herein in their entirety, as though individually incorporated by reference. In the event of inconsistent usages between this document and those documents so incorporated by reference, the usage in the incorporated reference(s) should be considered supplementary to that of this document; for irreconcilable inconsistencies, the usage in this document controls.

In this document, the terms "a" or "an" are used, as is common in patent documents, to include one or more than one, independent of any other instances or usages of "at least one" or "one or more." In this document, the term "or" is used to refer to a nonexclusive or, such that "A or B" includes "A but not B," "B but not A," and "A and B," unless otherwise indicated. In the appended claims, the terms "including" and "in which" are used as the plain-English equivalents of the respective terms "comprising" and "wherein." Also, in the following claims, the terms "including" and "comprising" are open-ended, that is, a system, device, article, or process that includes elements in addition to those listed after such a term in a claim are still deemed to fall within the scope of that claim. Moreover, in the following claims, the terms "first," "second," and "third," etc. are used merely as labels, and are not intended to impose numerical requirements on their objects.

Method examples described herein can be machine or computer-implemented at least in part. Some examples can include a computer-readable medium or machine-readable medium encoded with instructions operable to configure an electronic device to perform methods as described in the above examples. An implementation of such methods can include code, such as microcode, assembly language code, a higher-level language code, or the like. Such code can include computer readable instructions for performing various methods. The code may form portions of computer program products. Further, the code can be tangibly stored on one or more volatile or non-volatile tangible computer-readable media, such as during execution or at other times. Examples of these tangible computer-readable media can include, but are not limited to, hard disks, removable magnetic disks, removable optical disks (e.g., compact disks and digital video disks), magnetic cassettes, memory cards or sticks, random access memories (RAMs), read only memories (ROMs), and the like.

The above description is intended to be illustrative, and not restrictive. For example, the above-described examples (or one or more aspects thereof) may be used in combination with each other. Other embodiments can be used, such as by one of ordinary skill in the art upon reviewing the above description. The Abstract is provided to comply with 37 C.F.R. §1.72(b), to allow the reader to quickly ascertain the nature of the technical disclosure. It is submitted with the understanding that it will not be used to interpret or limit the scope or meaning of the claims. Also, in the above Detailed Description, various features may be grouped together to streamline the disclosure. This should not be interpreted as intending that an unclaimed disclosed feature is essential to any claim. Rather, inventive subject matter may lie in less than all features of a particular disclosed embodiment. Thus, the following claims are hereby incorporated into the Detailed Description, with each claim standing on its own as a separate embodiment, and it is contemplated that such embodiments can be combined with each other in various combinations or permutations. The scope of the invention should be determined with reference to the appended claims, along with the full scope of equivalents to which such claims are entitled.

What is claimed is:

1. A method comprising:
   detecting a first transition of a port from a coupled state to an uncoupled state using a first signal;
   debouncing the uncoupled state of the port using an oscillator;
   maintaining operation of a second state machine while the uncoupled state of the port is debounced;
   disabling the second state machine after successfully debouncing the uncoupled state of the port, wherein the disabling the second state machine includes isolating a bias signal from the port to provide a low-power operating mode; and
   wherein the debouncing the uncoupled state of port includes:
      resetting a counter;
      detecting if the uncoupled state of the port has changed;
      if the uncoupled state of the port has not changed, the method includes:
         incrementing the counter;
         checking if a value of the counter has reached a threshold value;
         if the value of the counter has reached the threshold value, the method includes indicating a successful debounce of the uncoupled state of the port; and
         if the value of the counter has not reached the threshold value, the method includes jumping to the detecting if the uncoupled state of the port has changed.

2. The method of claim 1, including disabling the oscillator and the first state machine after successfully debouncing the uncoupled state of the port.

3. The method of claim 1, wherein if the uncoupled state of the port has changed to the coupled state, the method includes debouncing the coupled state of the port using the oscillator.

4. The method of claim 1, including:
   detecting a second transition of the port from the uncoupled state to the coupled state using the first signal;
   enabling a disabled oscillator using the first signal;
   enabling a first state machine using the first signal;
   debouncing the coupled state of the port using the oscillator and the first state machine; and
   enabling a second state machine after successfully debouncing the coupled state of the port.

5. The method of claim 4, including disabling the oscillator and the first state machine after unsuccessfully debouncing the coupled state of the port.

6. The method of claim 4, wherein the debouncing the coupled state of the port includes:
   resetting a counter;
   detecting if the coupled state of the port has changed;
   if the coupled state of the audio connector has not changed, the method includes incrementing the counter;
   checking if a value of the counter has reached a threshold value;
   if the value of the counter has reached a threshold value, the method includes:
      indicating a successful debounce of the coupled state of the port; and
   if the value of the counter has not reached the threshold value, the method includes:
      jumping to the detecting if the coupled state of the first port has changed.

7. The method of claim 6, wherein if the coupled state of the port has changed to an uncoupled state, the method includes resetting the counter.

8. The method of claim 4, wherein enabling the second state machine includes coupling the bias signal to the port.

9. The method of claim 1, wherein isolating a bias signal from the port includes isolating a microphone bias signal from an audio port.

10. An apparatus for providing a low-power operating mode, the apparatus comprising;
    an audio port configured to provide a bias signal to an accessory device during a coupled state;
    a first state machine configured to debounce transitions of the audio port between the coupled state and an uncoupled state;
    a switch configured to isolate the bias signal from the audio port during the uncoupled state to provide the low-power operating mode; and
    wherein the first state machine is configured to reset a value of a counter upon first detecting the uncoupled state, to repeatedly increment the counter if the uncoupled state remains unchanged, to provide an indication of a successful debounce of the uncoupled state of the port if the value of the counter has reached a threshold value.

11. The apparatus of claim 10, including a reset circuit configured to receive a signal indicative of a first transition of the audio port from the coupled state to the uncoupled state, and to maintain operation of a second state machine while the first transition is debounced.

12. The apparatus of claim 11, wherein the reset circuit is configured to to receive a signal indicative of a second transition of the audio port from the uncoupled state to the coupled state, and to enable an oscillator and the first state machine to debounce the second transition.

13. A portable electronic device comprising:
    a port configured to couple to an accessory device, the port including a first switch configured to provide an indication of a coupled state of the port and an uncoupled state of the port;
    a first state machine configured to debounce transitions between the coupled state and the uncoupled state, wherein the first state machine is configured to reset a value of a counter upon first detecting the uncoupled state, to repeatedly check for persistence of the uncoupled state and increment the counter, and to provide an indication of a successful debounce of the uncoupled state of the port if the value of the counter has reached a threshold value;
a second state machine configured to process information received from the accessory device during the coupled state;
a second switch configured to couple a bias signal to the port during the coupled state and to isolate the bias signal from the port during the uncoupled state; and
a reset circuit configured to initiate the first state machine upon a transition of the port from the uncoupled state to the coupled state, and to maintain operation of the second state machine during a transition of the port from the coupled state to the uncoupled state.

14. The portable electronic device of claim 13, wherein the port includes an audio port.

15. The portable electronic device of claim 13, wherein the port includes an audio jack receptacle.

* * * * *